(12) United States Patent
Pindl et al.

(10) Patent No.: US 10,217,913 B2
(45) Date of Patent: Feb. 26, 2019

(54) METHOD FOR PRODUCING OPTOELECTRONIC SEMICONDUCTOR DEVICES AND OPTOELECTRONIC SEMICONDUCTOR DEVICE

(71) Applicant: OSRAM Opto Semiconductors GmbH, Regensburg (DE)

(72) Inventors: Markus Pindl, Tegernheim (DE); Thomas Schwarz, Regensburg (DE); Frank Singer, Regenstauf (DE); Sandra Sobczyk, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/036,413

(22) PCT Filed: Oct. 30, 2014

(86) PCT No.: PCT/EP2014/073369
§ 371 (c)(1),
(2) Date: May 12, 2016

(87) PCT Pub. No.: WO2015/071109
PCT Pub. Date: May 21, 2015

(65) Prior Publication Data
US 2016/0293812 A1     Oct. 6, 2016

(30) Foreign Application Priority Data
Nov. 14, 2013 (DE) .................. 10 2013 112 549

(51) Int. Cl.
*H01L 33/54* (2010.01)
*H01L 33/00* (2010.01)
(Continued)

(52) U.S. Cl.
CPC .......... *H01L 33/54* (2013.01); *H01L 31/0203* (2013.01); *H01L 31/02322* (2013.01);
(Continued)

(58) Field of Classification Search
CPC ... H01L 33/54; H01L 33/0095; H01L 33/502; H01L 31/186; H01L 31/0203;
(Continued)

(56) References Cited

U.S. PATENT DOCUMENTS

2011/0018017 A1* 1/2011 Bierhuizen ............ H01L 33/46
257/98
2011/0049545 A1* 3/2011 Basin .................... H01L 33/56
257/98

(Continued)

FOREIGN PATENT DOCUMENTS

DE        10245946 C1    10/2003
DE    102009036621 A1     2/2011
(Continued)

OTHER PUBLICATIONS

"LCW JDSH.EC", Duris E5 Datasheet Version 2.0, OSRAM Opto Semiconductors; Oct. 17, 2012, pp. 1-23.
(Continued)

*Primary Examiner* — Mouloucoulaye Inoussa
(74) *Attorney, Agent, or Firm* — McDermott Will & Emery LLP

(57) ABSTRACT

The invention relates to a method for producing a plurality of optoelectronic semiconductor components, comprising the following steps: preparing a plurality of semiconductor chips spaced in a lateral direction to one another; forming a housing body assembly, at least one region of which is arranged between the semiconductor chips; forming a plurality of fillets, each adjoining a semiconductor chip and being bordered in a lateral direction by a side surface of each (Continued)

Figure 2A:
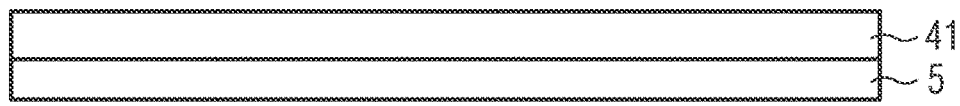

semiconductor chip and the housing body assembly; and separating the housing body assembly into a plurality of optoelectronic components, each component having at least one semiconductor chip and a portion of the housing body assembly as a housing body, and each semiconductor chip not being covered by material of the housing body on a radiation emission surface of the semiconductor component, which surface is located opposite a mounting surface. The invention also relates to a semiconductor component.

9 Claims, 4 Drawing Sheets

(51) Int. Cl.
H01L 31/0203 (2014.01)
H01L 31/0232 (2014.01)
H01L 31/18 (2006.01)
H01L 33/50 (2010.01)
H01L 33/48 (2010.01)
H01L 33/56 (2010.01)
H01L 21/56 (2006.01)

(52) U.S. Cl.
CPC ........ *H01L 31/186* (2013.01); *H01L 33/0095* (2013.01); *H01L 33/502* (2013.01); *H01L 21/568* (2013.01); *H01L 33/486* (2013.01); *H01L 33/505* (2013.01); *H01L 33/56* (2013.01); *H01L 2224/18* (2013.01); *H01L 2224/24* (2013.01); *H01L 2224/2518* (2013.01); *H01L 2224/82* (2013.01); *H01L 2933/005* (2013.01); *H01L 2933/0033* (2013.01); *H01L 2933/0041* (2013.01); *H01L 2933/0058* (2013.01)

(58) Field of Classification Search
CPC ... H01L 31/02322; H01L 33/56; H01L 24/97; H01L 33/005; H01L 33/46; H01L 33/486; H01L 33/505; H01L 33/58; H01L 33/60
USPC ............ 257/98; 438/27, 29, 22, 82, 98, 106; 294/184
See application file for complete search history.

(56) References Cited

U.S. PATENT DOCUMENTS

| 2012/0056228 A1* | 3/2012 | Horng .................. H01L 33/486 257/98 |
| 2012/0112220 A1 | 5/2012 | West et al. |
| 2013/0187178 A1 | 7/2013 | Tischler |

FOREIGN PATENT DOCUMENTS

| DE | 102010024864 A1 | 12/2011 |
| DE | 102012101102 A1 | 8/2013 |
| EP | 2701214 A1 | 2/2014 |
| JP | 2012-227470 A | 11/2012 |
| WO | 2011/161183 A1 | 12/2011 |
| WO | 2012/144030 A1 | 10/2012 |

OTHER PUBLICATIONS

"LCW JNSH.PC", Duris E3 Datasheet Version 2.0—SO-PCN-2012-038-A; OSRAM Opto Semiconductors; Oct. 17, 2012, pp. 1-22.

* cited by examiner

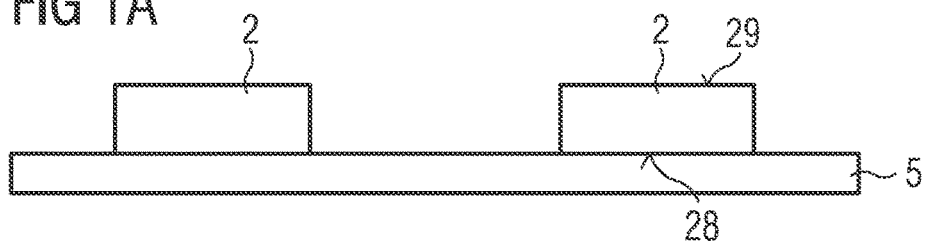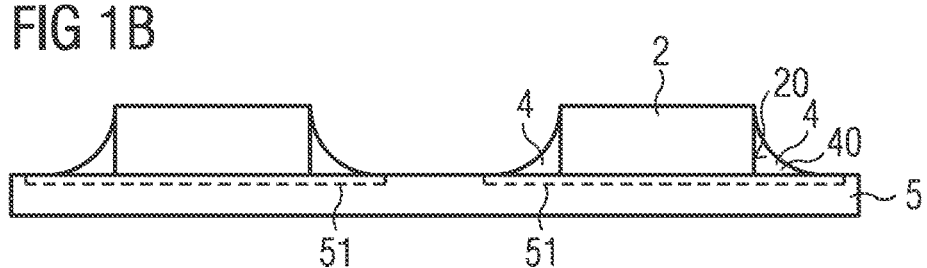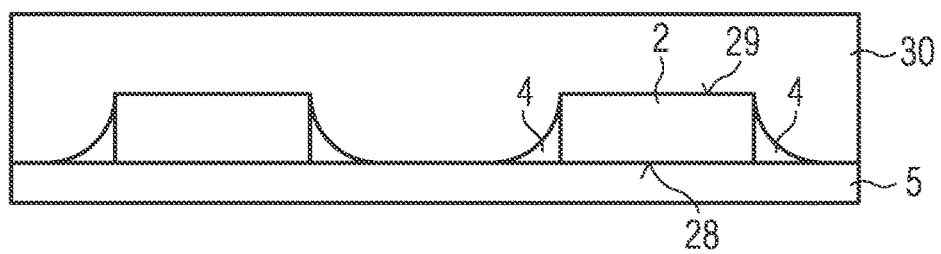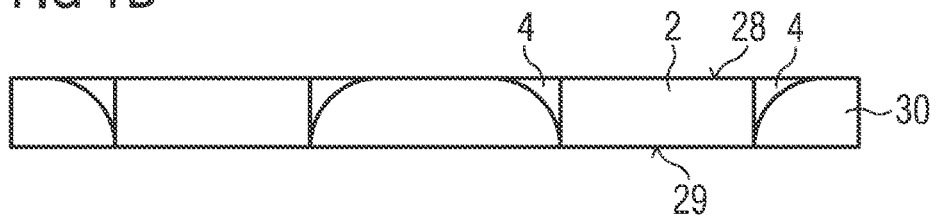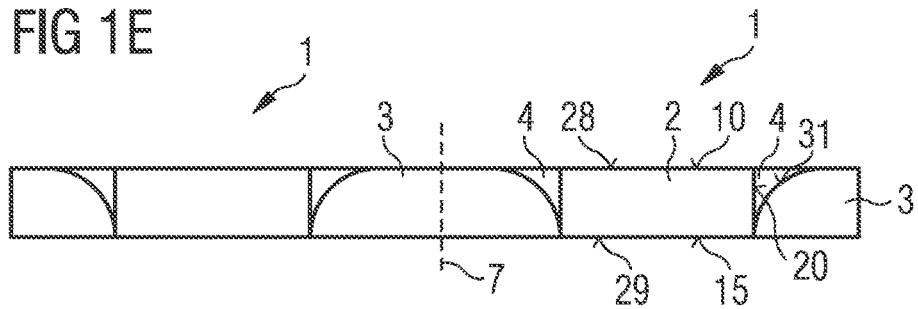

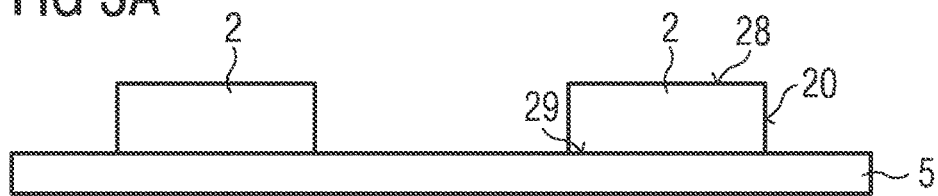
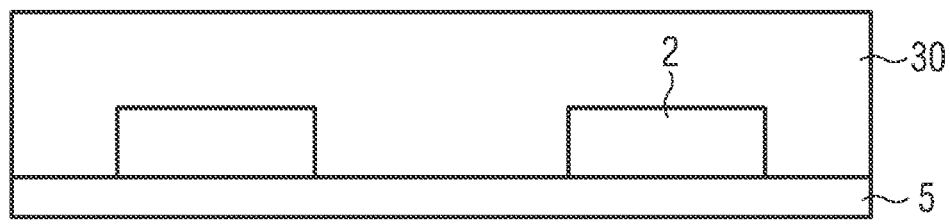
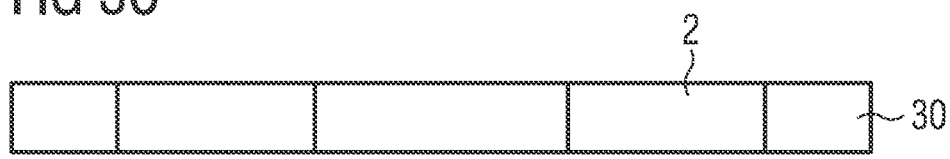
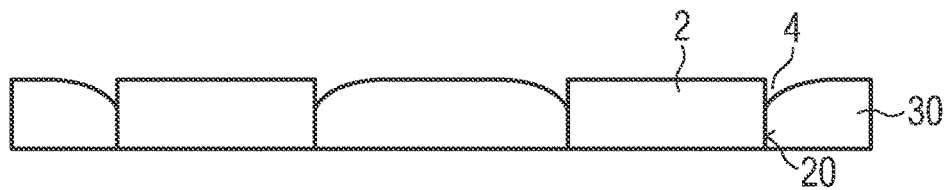
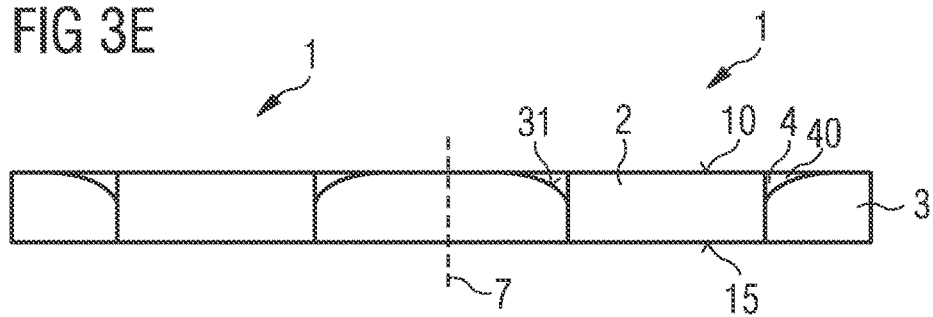

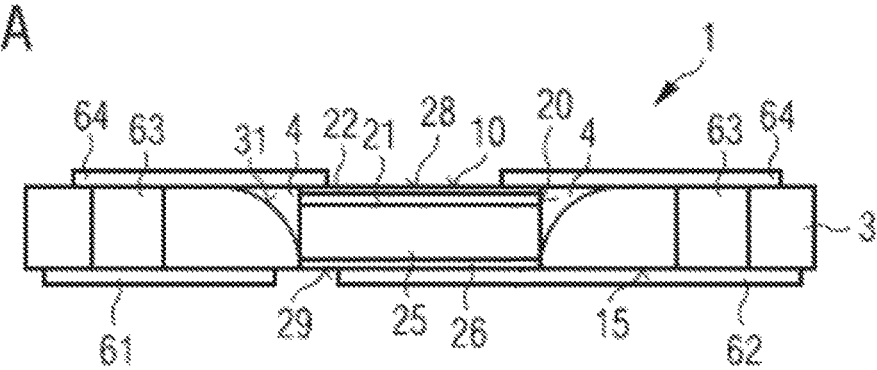
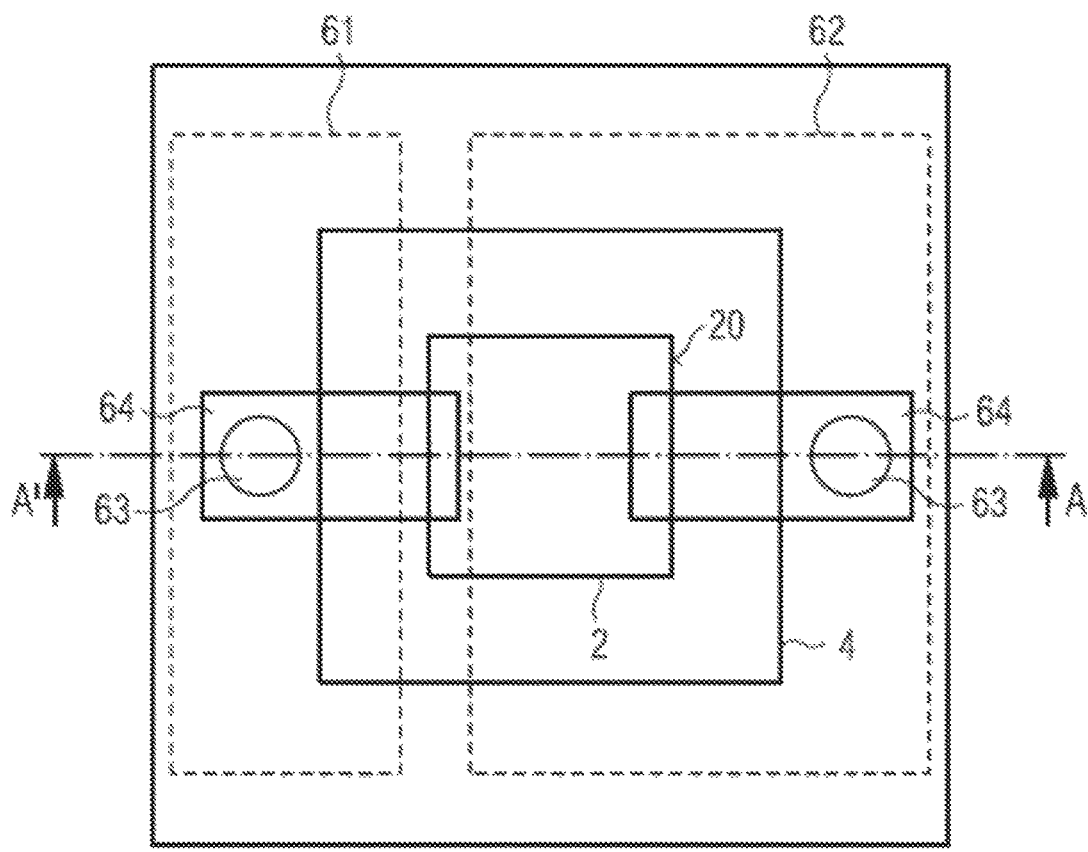

METHOD FOR PRODUCING OPTOELECTRONIC SEMICONDUCTOR DEVICES AND OPTOELECTRONIC SEMICONDUCTOR DEVICE

Arrangements are for example known for semiconductor devices such as light-emitting diodes in which the semiconductor chips provided for generating radiation are mounted in prefabricated packages. It is difficult to miniaturize such arrangements to produce particularly compact LEDs.

One object is to provide a method for producing optoelectronic semiconductor devices reliably and compactly and with high outcoupling efficiency. Furthermore, such a semiconductor device is to be provided.

These objects are achieved inter alia respectively by a method and a semiconductor device according to the independent claims. Configurations and convenient aspects constitute the subject matter of the dependent claims.

A method is provided for producing a plurality of optoelectronic semiconductor devices.

According to at least one embodiment of the method, the method comprises a step in which a plurality of semiconductor chips is provided. The in particular optoelectronic semiconductor chips are spaced from one another in a lateral direction. For example, the semiconductor chips are present on an auxiliary carrier. The auxiliary carrier may be of flexible construction, for example in the form of a film, or rigid.

According to at least one embodiment of the method, said method comprises a step in which a package body assembly is formed, which is arranged at least in part between the semiconductor chips. The package body assembly is produced in particular by means of a molding method. The term molding method here covers all production methods in which a molding composition is introduced into a predetermined mold and in particular is subsequently cured. In particular, the term molding method encompasses casting, injection molding, transfer molding and compression molding.

The package body assembly and thus the package body formed from the package body assembly is formed in particular to be radiation-opaque for the radiation emitted or to be detected by the semiconductor chip during operation of the semiconductor device.

In one variant configuration, the package body is radiation-reflective, i.e. the package body has a reflectivity of at least 55%. The reflectivity preferably amounts to at least 80%.

In one alternative variant configuration, the package body is radiation-absorbent. In other words, the package body absorbs at least 55% of the incident radiation. The package body is formed for example by a black material.

The semiconductor chips in particular comprise a semiconductor body with an active region provided for generating radiation. The semiconductor body, in particular the active region, contains for example a III-V compound semiconductor material. Furthermore, the semiconductor chip in particular comprises a carrier, on which the semiconductor body is arranged. The carrier is for example a growth substrate for the semiconductor layers of the semiconductor body. Alternatively, the carrier is different from a growth substrate for the semiconductor layers of the semiconductor body. In this case, the carrier serves in mechanical stabilization of the semiconductor body, such that the growth substrate is not necessary therefor and may be removed.

A semiconductor chip in which the growth substrate has been removed is also known as a thin-film semiconductor chip.

According to at least one embodiment of the method, the method comprises a step in which a plurality of fillets are formed, which each adjoin a semiconductor chip. In the lateral direction the fillets are each delimited by a side face of the respective semiconductor chip and the package body assembly. In the region of the fillets, the package body assembly thus does not directly adjoin the side face of the semiconductor chips.

In the vertical direction the fillets may extend over the entire height of the semiconductor chip or only over a part of the semiconductor chip. In case of doubt, a vertical direction is understood to mean a direction which extends perpendicular to the mounting surface of the semiconductor device. Accordingly, a lateral direction runs parallel to the mounting surface.

The fillets are provided in particular to increase the outcoupling efficiency of the semiconductor chips.

According to at least one embodiment of the method, the method comprises a step in which the package body assembly is singulated into a plurality of optoelectronic semiconductor devices, wherein each singulated semiconductor device has at least one semiconductor chip and part of the package body assembly as package body.

The package bodies arise from the package body assembly, i.e. only on singulation and thus at a time when the semiconductor chips are already located in the package body.

According to at least one embodiment of the method, on singulation of the package body assembly the semiconductor chips are each free of package body material on a semiconductor device radiation exit face opposite a mounting surface. Furthermore, the semiconductor chips on the mounting surface may be free of the package body material. On the radiation exit face and optionally also on the mounting surface there is thus no package body material apart possibly from residues resulting from manufacture. The semiconductor chips arranged in the package body and connected mechanically stably to the package body are thus embedded in the package body only in the lateral direction. In the vertical direction, the semiconductor chips may extend right through the package body.

In at least one embodiment of the method for producing a plurality of optoelectronic semiconductor devices, a plurality of semiconductor chips are provided which are spaced from one another in a lateral direction. A package body assembly is formed which is arranged at least in part between the semiconductor chips. A plurality of fillets are formed, which each adjoin a semiconductor chip and which are delimited in the lateral direction by a side face of the respective semiconductor chip and the package body assembly. The package body assembly is singulated into a plurality of optoelectronic semiconductor devices, wherein each semiconductor device comprises at least one semiconductor chip and a part of the package body assembly as package body and wherein the semiconductor chips are free of package body material on a radiation exit face of the semiconductor device opposite a mounting surface.

By means of the fillet, efficiency of outcoupling from the semiconductor chip may be increased in the case of a semiconductor device in the form of a radiation emitter. The maximum lateral extent of the fillet preferably amounts to at most 100 µm, particularly preferably at most 50 µm. Compact configuration of the semiconductor device is thus made simpler.

According to at least one embodiment of the method, the semiconductor chips are each free of package body material on the mounting surface. The semiconductor chips are thus accessible on the mounting surface, for example for thermal contacting and/or electrical contacting.

According to at least one embodiment of the method, the fillet is radiation-transmissive. In particular, the fillet is transparent or at least translucent for the radiation generated or to be detected by the semiconductor device during operation. The generated radiation may be coupled into the fillet at a side face of the semiconductor chip and exit from the fillet at the radiation exit face.

According to at least one embodiment of the method, the fillet has a reflectivity of at least 80%. In particular, the fillet has a higher reflectivity than the package body material. In this case, the absorption losses may be reduced by means of the fillet.

According to at least one embodiment of the method, to form the fillets the semiconductor chips are encapsulated prior to formation of the package body assembly in such a way with an encapsulating material that the side faces of the semiconductor chips are at least partly covered and the encapsulating material is encapsulated on formation of the package body assembly by a molding composition for the package body assembly. Formation of the fillets, in particular definition of the geometric shape of the fillets, thus proceeds at least in part before the package body assembly is formed. At those points at which the encapsulating material is present, the molding composition for the package body assembly does not directly adjoin the side face of the semiconductor chips to be encapsulated.

According to at least one embodiment of the method, the semiconductor chips are arranged on an auxiliary carrier during formation of the package body assembly and/or during formation of the plurality of fillets. Prior to singulation of the package body assembly, the auxiliary carrier may be removed.

A film, for instance a self-adhesive film, or a rigid carrier are examples of suitable auxiliary carriers.

According to at least one embodiment of the method, the encapsulating material is applied such that it in each case at least partly covers the side faces of the semiconductor chips and the auxiliary carrier. On application of the encapsulating material, the semiconductor chips have thus already been arranged on the auxiliary carrier. The encapsulating material is applied in particular onto the semiconductor chips such that the major face, remote from the auxiliary carrier, of the semiconductor chips remains free of the encapsulating material. The encapsulating material may for example be printed on or applied by means of a dispenser.

According to at least one embodiment of the method, the encapsulating material is applied to an auxiliary carrier and the semiconductor chips are pressed into the encapsulating material such that the encapsulating material covers the side faces of the semiconductor chips at least in part. In this case, the encapsulating material may serve at the same time to fasten the semiconductor chips to the auxiliary carrier. The thickness of the encapsulating material is adjusted in this respect purposefully such that the side faces of the semiconductor chips are wetted completely or at least in part with the encapsulating material. The major face of the semiconductor chips remote from the auxiliary carrier remains free of the encapsulating material.

According to at least one embodiment of the method, the encapsulating material is a filler material, which remains in the semiconductor devices. The filler material is a radiation-transmissive material, for example. The filler material may furthermore contain a radiation conversion material, which is provided for at least partial radiation conversion of radiation generated in the semiconductor chips.

Alternatively, the filler material may have a reflectivity of at least 80% for the radiation to be generated and/or received by the semiconductor chip. A reflective fillet allows the prevention or at least the reduction of radiation absorption at the package body, in particular even in the case of an absorbent package body.

According to at least one embodiment of the method, the encapsulating material is an auxiliary material which is removed once the package body assembly has been formed. The auxiliary material thus serves merely to form the plurality of fillets during formation of the package body assembly. In other words, the geometric shape of the subsequent fillets is fixed by the auxiliary material. The auxiliary material thus prevents the molding composition from completely covering the side faces of the semiconductor chips to be encapsulated during formation of the package body assembly. A suitable auxiliary material is an adhesive which is comparatively easy to remove, for example by the action of temperature, a solvent and/or a wet chemical etching method.

According to at least one embodiment of the method, formation of the plurality of fillets proceeds after formation of the package body assembly. The molding composition of the package body assembly may thus completely cover the side faces of the semiconductor chips prior to formation of the fillets. To form the fillets, material of the package body assembly is for example removed. This proceeds for example by means of coherent radiation, for instance laser radiation. Formation of the fillets preferably proceeds such that the molding composition of the package body assembly adjoins the side faces of the semiconductor chips with a surface coverage of at most 50% of the side faces.

According to at least one embodiment of the method, the fillet is filled with a filler material after formation of the package body assembly. Compared with an unfilled fillet, the refractive index difference at the side face of the semiconductor chip may be reduced by means of the filler material.

According to at least one embodiment of the method, the semiconductor chips are covered over on formation of the package body assembly and the package body assembly is then thinned, such that the semiconductor chips are uncovered in places. The major face, remote from the auxiliary carrier, of the semiconductor chips is thus initially covered over by the material of the package body assembly and then uncovered again. Thinning of the package body assembly may for example proceed mechanically, for instance by means of grinding or lapping.

Through uncovering of the semiconductor chips, semiconductor devices may be produced in which the waste heat generated in the semiconductor chips during operation may be dissipated directly at the mounting surface of the semiconductor devices, without the heat having to pass through the material of the package body.

According to at least one embodiment, an optoelectronic semiconductor device comprises a mounting surface and a radiation exit face opposite the mounting surface. The semiconductor device additionally comprises a semiconductor chip provided for generating and/or receiving radiation.

According to at least one embodiment of the optoelectronic semiconductor device, the semiconductor device comprises a package body which surrounds the semiconductor chip in a lateral direction, wherein the semiconductor chip is free of package body material at the radiation exit face. The package body for example does not project or at least projects only insignificantly, for example by at most 10 µm, beyond the semiconductor chip in the vertical direction on the opposite side from the mounting surface.

According to at least one embodiment of the optoelectronic semiconductor device, a side face of the semiconductor chip is adjoined by a fillet, which is delimited in a lateral direction extending parallel to the mounting surface by the side face of the semiconductor chip and the package body.

In at least one embodiment of the optoelectronic semiconductor device, the semiconductor device comprises a mounting surface and a radiation exit face opposite the mounting surface. The semiconductor device comprises a semiconductor chip provided for generating and/or receiving radiation. The semiconductor device comprises a package body which surrounds the semiconductor chip in a lateral direction. The semiconductor chip is free of the package body material at the radiation exit face. A side face of the semiconductor chip is adjoined by a fillet, which is delimited in a lateral direction running parallel to the mounting surface by the side face of the semiconductor chip and the package body.

The package body may adjoin the semiconductor chip directly in places in the lateral direction or be spaced from the semiconductor chip at all points over the entire circumference of the semiconductor chip. The package body is preferably at a distance of at most 10 µm from the semiconductor chip at at least one point. In this way, a particularly compact semiconductor device may be obtained.

According to at least one embodiment of the semiconductor device, the fillet extends over the entire circumference of the semiconductor chip. The package body thus, at least in places in the vertical direction, does not directly adjoin the semiconductor chip over the entire circumference.

According to at least one embodiment of the semiconductor device, the fillet tapers in the direction of the mounting surface when viewed from the radiation exit face. For example, the fillet comprises convex curvature when viewed from the radiation exit face.

Radiation exiting from the side face of the semiconductor chip may in this way be efficiently deflected towards the normal to the radiation exit face.

According to at least one embodiment of the semiconductor device, the fillet contains a radiation conversion material. The radiation conversion material is for example provided for converting primary radiation generated in the semiconductor chip with a first peak wavelength into secondary radiation with a second peak wavelength different from the first peak wavelength. For example, the semiconductor device is provided for generating a mixed light, in particular a mixed light that appears white to the human eye.

The above-described method for producing optoelectronic semiconductor devices is particularly suitable for producing the optoelectronic semiconductor device. Features listed in connection with the method may therefore also be used for the semiconductor device and vice versa.

Further features, configurations and convenient aspects are revealed by the following description of the exemplary embodiments in conjunction with the figures.

Identical, similar or identically acting elements are provided with the same reference numerals in the figures.

The figures and the size ratios of the elements illustrated in the figures relative to one another are not to be regarded as being to scale. Rather, individual elements and in particular layer thicknesses may be illustrated on an exaggeratedly large scale for greater ease of depiction and/or better comprehension.

In the Figures:

FIGS. 1A to 1E, 2A to 2E and 3A to 3E each show an exemplary embodiment of a method for producing optoelectronic semiconductor devices on the basis of intermediate steps illustrated in each case in schematic sectional view; and FIGS. 4A and 4B show an exemplary embodiment of a semiconductor device in plan view (FIG. 4B) and associated sectional view (FIG. 4A).

FIGS. 1A to 1E show a first exemplary embodiment of a method for producing a plurality of optoelectronic semiconductor devices. As shown in FIG. 1A, a plurality of semiconductor chips 2 are arranged on an auxiliary carrier 5. The description below relates to radiation-emitting semiconductor devices, by way of example. The semiconductor chips are for example luminescent diode semiconductor chips, for instance light-emitting diode semiconductor chips. In contrast thereto, the semiconductor devices may however also be provided for receiving radiation and for example comprise a semiconductor chip in the form of a photodiode.

In a vertical direction the semiconductor chips 2 extend between a front 28 and a back 29. The front is that side of the semiconductor chips through which the radiation generated in the semiconductor chips exits during operation of the subsequent semiconductor devices. The semiconductor chips are arranged in such a way on the auxiliary carrier 5 that the front faces the auxiliary carrier.

A self-adhesive film is for example suitable for the auxiliary carrier 5. Alternatively, the semiconductor chips may also be fastened by means of a temporary adhesive, by means of a wax, by means of "Expancel microspheres" or by means of a silicone. The agent bringing about adhesion of the semiconductor chips may be provided solely under the semiconductor chips, such that the auxiliary carrier between the semiconductor chips is uncovered. Alternatively, the auxiliary carrier may be covered over its entire surface.

A filler material 40 is applied to the auxiliary carrier 5 such that the filler material covers the side faces 20 of the semiconductor chips completely or at least in part. This may proceed for example by means of a dispenser. Optionally, the auxiliary carrier 5 may be patterned in the lateral direction in such a way that it comprises wetting areas 51. The wetting areas display higher wettability than the regions arranged between the wetting areas 51 of the surface of the auxiliary carrier 5 facing the semiconductor chips 2. For example, the wetting areas 51 may be hydrophilic and the further regions of the surface of the auxiliary carrier 5 may be hydrophobic. For example, silicone may be distinguished by hydrophobic properties.

The geometric shape of the fillets is thus not determined by a predefined mold, but rather self-organized.

In particular, the geometric shape may be adjusted by the material properties of the filler material 40, for example surface tension and viscosity, and the wettability of the auxiliary carrier and of the semiconductor chips 2 with the filler material.

The lateral extent of the fillet 4 reduces from the front 28 of the semiconductor chip towards the back 29. In the exemplary embodiment shown, the auxiliary carrier 5 is free of the filler material in places, between adjacent semiconductor chips 2.

Then the semiconductor chips 2 are encapsulated, with the fillets 4 adjoining the semiconductor chips 2 in the lateral direction, by a molding composition to form a package body assembly 30 (FIG. 1C). In the exemplary embodiments shown, the package body assembly 30 also covers the back 29 of the semiconductor chips 2. Formation of the package body assembly 30 proceeds for example by means of a molding method.

In a subsequent production step, the package body assembly 30 may be thinned from the side remote from the auxiliary carrier 5, for example by means of a mechanical method such as grinding.

Instead of covering over the semiconductor chips 2 on the back 29 and subsequently thinning the package body assembly 30, the package body assembly may also be formed such that the backs 29 of the semiconductor chips 2 are uncovered. To this end, a film-assisted molding method may be used, for example.

FIG. 1D shows the package body assembly 30 with the semiconductor chips 2 embedded therein after removal of the auxiliary carrier 5. After removal of the auxiliary carrier 5, the front 28 of the semiconductor chip is accessible, for example for electrical contacting of the semiconductor chips. To simplify representation, this is not shown in the figures and, like possible configurations of the semiconductor chips, is explained with reference to FIGS. 4A and 4B.

For singulation into semiconductor devices 1, the package body assembly 30 may be divided along singulation lines 7. This may for example proceed mechanically, for instance by means of sawing, chemically, for example by means of etching, and/or by means of coherent radiation, for instance by laser ablation.

In the case of a radiation-transmissive fillet 4, radiation may also exit through the side faces 20 of the semiconductor chip 2 when the semiconductor device is in operation. A boundary surface 31 arising between the fillet 4 and the package body 3 resulting from the package body assembly may form a reflector face, by which the laterally exiting radiation may be focused.

The filler material 40 may furthermore be mixed with a radiation conversion material, which converts radiation generated when the semiconductor chips 2 are in operation, for example blue radiation, at least in part into secondary radiation, for example into yellow radiation.

In the case of a radiation-transmissive fillet 4, the boundary surface 31 is reflective and for example has a reflectivity of at least 80%. For example, the package body 3 is formed by a material which is mixed with white pigments.

Alternatively, the fillet 4 may itself also be formed from a filler material which has a high reflectivity for the radiation generated in the semiconductor chip, for example a reflectivity of at least 80%. The fillet thus also protects the package body 3 from damage by radiation generated in the semiconductor chip during operation.

The material for the package body 3 may be selected irrespective of the optical properties and of the radiation stability thereof. For example, a black epoxide material ("black epoxy") is suitable in this case for the package body 3. Such a material is particularly cheaply available due to its being widely used in the electronics industry and is distinguished by good processability.

The back 29 of the semiconductor chips 2 is uncovered at a mounting surface 15 of the semiconductor device 1, such that the waste heat generated in the semiconductor chip can be efficiently dissipated via the mounting surface 15 during operation. In contrast thereto, it is however also feasible for the material of the package body 3 to cover the back 29 of the semiconductor chip 2.

On the side remote from the mounting surface, the package body does not project or at least does not project significantly beyond the semiconductor chip in the vertical direction. A particularly compact arrangement is thereby made simpler.

The second exemplary embodiment shown in FIGS. 2A to 2E corresponds substantially to the first exemplary embodiment described in connection with FIGS. 1A to 1E. Unlike in the first exemplary embodiment, an auxiliary material 41 is applied to the auxiliary carrier 5, before even the semiconductor chips 2 are fastened to the carrier 5 (FIG. 2A). Application of the auxiliary material may proceed for example by means of printing or a jetting method.

Figure 2B:
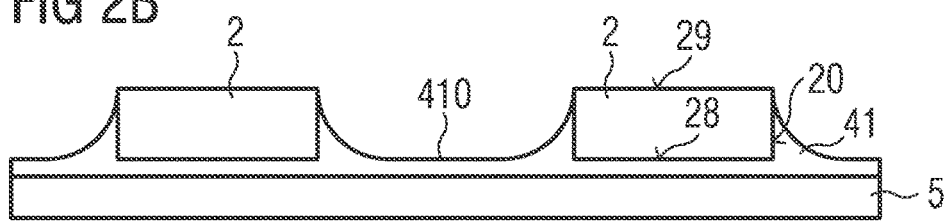

Then, the semiconductor chips 2 are pressed into the auxiliary material 41, such that the auxiliary material 41 wets the side faces 20 of the semiconductor chips 2. A meniscus 410 forms in the auxiliary material 41 between adjacent semiconductor chips 2. The auxiliary material 41 has a smaller vertical extent in the region of the meniscus 410 than in the region in which the auxiliary material adjoins the semiconductor chips 2 (FIG. 2B).

The auxiliary material 41 thus also serves in fastening the semiconductor chips 2 to the auxiliary carrier 5.

A material which is particularly suitable as the auxiliary material 41 is a material which can be simply and reliably removed in a subsequent method step without the risk of damage to the further elements.

Figure 2C:
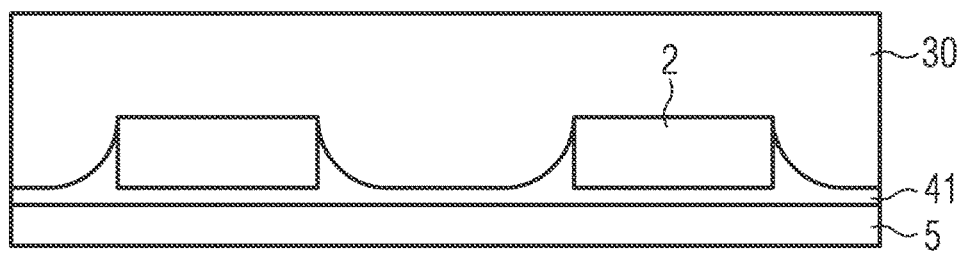

As shown in FIG. 2C, the semiconductor chips 2 and the auxiliary material 41 are then encapsulated by a molding composition to form a package body assembly 30. This may take place as described in connection with FIG. 1C. As a result of the auxiliary material 41, the package body assembly 30 does not adjoin the semiconductor chips 2, or at least does so with a surface coverage of at most 20%, preferably of at most 10%.

Figure 2D:
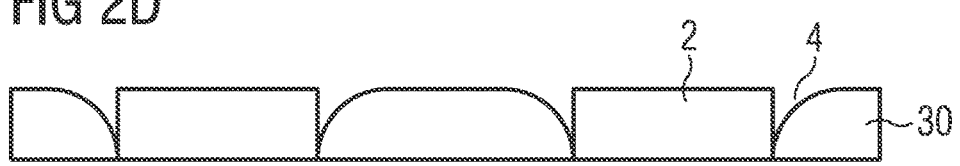

FIG. 2D shows a stage in the method in which the auxiliary carrier 5 and the auxiliary material 41 have been removed. Depending on the auxiliary material, suitable means of removing said auxiliary material are for example a solvent, an etching method or heat treatment, in which the auxiliary material 41 melts.

The fillet 4 formed by means of the auxiliary material 41 may then be filled with a filler material 40. This may proceed for example by means of a metering method, for instance by means of a dispenser or by means of a molding method.

In terms of the optical properties thereof, the fillet 4 may be configured as described in connection with FIG. 1A. Alternatively, it is also feasible for the fillet 4 not to be filled with a filler material, but rather to remain empty. This maximizes the refractive index difference at the side face 20 of the semiconductor chip 2. As a result of total reflection, the fraction of the radiation which may exit through the side face 20 of the semiconductor chips 2 is thus minimized.

The third exemplary embodiment shown in FIGS. 3A to 3E corresponds substantially to the first exemplary embodiment described in conjunction with FIGS. 1A to 1E. Unlike in the first exemplary embodiment, the semiconductor chips 2 provided on the auxiliary carrier 5 (FIG. 3A) are firstly encapsulated by a molding composition to form a package body assembly 30, such that the molding composition adjoins the side faces 20 of the semiconductor chips 20 over the entire surface. In contrast to the first exemplary embodiment, the semiconductor chips 2 are placed such that the back 29 of the semiconductor chips faces the auxiliary carrier 5.

As shown in FIGS. 3B and 3C, formation of the package body assembly 30 may in turn proceed such that the semiconductor chips 2 are initially completely embedded in the molding composition for the package body assembly 30 and then the package body assembly is thinned such that the front 28 of the semiconductor chips 2 is uncovered.

Material of the package body assembly 30 which adjoins the side faces 20 of the semiconductor chips is then removed in places. This may be achieved for example by laser ablation. In the vertical direction the fillet 4 extends only over part of the side face 20 of the semiconductor chips 2, such that material of the package body assembly 30 adjoins the side face 20 even after formation of the fillet 4. The larger the region in which the package body assembly 30 adjoins the semiconductor chips 2, the easier it is to achieve a mechanically stable connection between the semiconductor chips 2 and the package body assembly 30. On the other hand, outcoupling efficiency may be improved by greater vertical extension of the fillets 4. The surface coverage with which the package body assembly 30 covers the side faces 20 of the semiconductor chip 2 after formation of the fillets 4 preferably amounts to at most 50%.

Figure 2E:
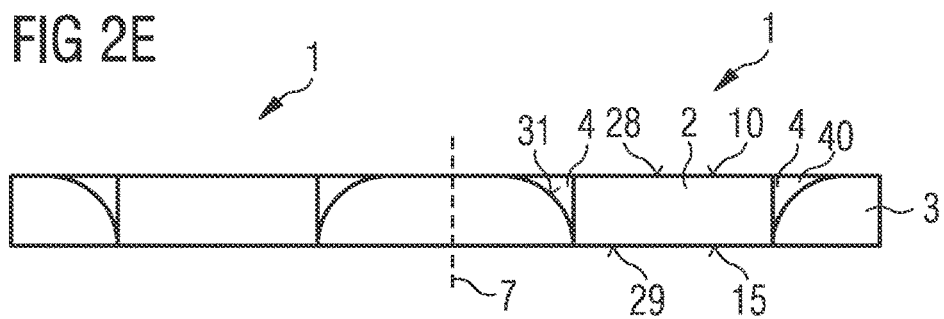

After formation of the fillets 4, the latter may be filled or not filled as described in connection with FIG. 2E.

An exemplary embodiment for a semiconductor device is shown in FIG. 4B in plan view and in schematic sectional view along line AA' in FIG. 4A. The semiconductor device 1 comprises a semiconductor chip 2. The semiconductor chip 2 comprises a semiconductor body 21 with an active region 22 provided for generating radiation and a substrate 25. A mirror layer 26 is formed on the back 29 of the semiconductor chip 2. The mirror layer may for example be a metallic mirror layer or a Bragg reflector with a plurality of dielectric layers. On a front 28 the semiconductor chip 2 comprises two lands for electrical contacting of the semiconductor chip (not illustrated explicitly).

The substrate 25 is for example the growth substrate for the semiconductor body 21. A suitable substrate is for example a radiation-transmissive substrate such as sapphire or silicon carbide. In the lateral direction the semiconductor chip 2 is enclosed by a package body 3. A fillet 4 is formed between the package body 3 and the semiconductor chip 2. The fillet 4 surrounds the semiconductor chip 2 in the lateral direction over the entire circumference. Furthermore, the fillet 4 has a lateral extent which decreases as the distance from the radiation exit face 10 of the semiconductor device 1 increases. The fillet 4 may be radiation-transmissive or reflective, as described in connection with FIG. 1E.

On a mounting surface 15 opposite the radiation exit face 10, the semiconductor device 1 comprises a first contact 61 and a second contact 62. By applying an external electrical voltage between these contacts, charge carriers may be injected from different sides into the active region 22 and there recombine with emission of radiation. The first contact 61 and the second contact 62 are each electrically conductively connected with the semiconductor chip 2 by way of through-vias 63 through the package body 3 and connecting conductors 64. The connecting conductors 64 extend in the lateral direction beyond the side face 20 of the semiconductor chip 2 and cover part of the package body 3. In the described exemplary embodiment the connecting conductor 64 takes the form of a coating. In contrast thereto, a wire bond connection may however also be used. On the side opposite the mounting surface 15, the semiconductor device 1 may comprise a radiation conversion element (not illustrated explicitly).

The geometric arrangement of the contacts and contact guidance to the semiconductor chip 2 may however be varied within limits. For example, a semiconductor chip may also be used which has a front and a rear land. In this case only a through-via 63 is necessary. A semiconductor chip with two rear lands is also conceivable. For example, the semiconductor chip 2 may also take the form of a thin-film semiconductor chip with an electrically conductive substrate 25.

To determine the achievable efficiency, simulations were performed which were based on a semiconductor chip with a transparent substrate 25, such that radiation could also to a considerable degree be coupled out of the side face 20 of the semiconductor chips. A comparison structure, in which the semiconductor chip in each case adjoins a material with a reflectivity of 92% at the back and at the side faces, was used as the starting point for the simulations. A radiation conversion material was provided on the front of the semiconductor chips. By using a fillet surrounding the semiconductor chip, the boundary surface of which fillet, remote from the semiconductor chip, is inclined relative to the side face of the semiconductor chip by an angle of 45°, and which fillet is filled with a radiation conversion material, an increase in efficiency of 6% may be achieved.

If the fillet is not filled with a radiation conversion material, but rather with a silicone with a high refractive index of around 1.5, the efficiency can be increased by around 6.25% compared with the comparison structure. The simulations were in each case based on a semiconductor chip height of 150 µm.

The described fillet thus allows a significant increase in the efficiency of the semiconductor device to be achieved in a technically simple manner.

This patent application claims priority from German patent application 10 2013 112 549.2, the disclosure content of which is hereby included by reference.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. A method for producing a plurality of optoelectronic semiconductor devices, comprising the steps of:
    a) providing a plurality of semiconductor chips, which are spaced from one another in a lateral direction;
    b) forming a package body assembly, which is arranged at least in part between the semiconductor chips;
    c) forming a plurality of fillets, which each adjoin a semiconductor chip and which are delimited in the lateral direction by a side face of the respective semiconductor chip and the package body assembly; and
    d) singulating the package body assembly into a plurality of optoelectronic semiconductor devices, wherein each semiconductor device comprises at least one semiconductor chip and a part of the package body assembly as its package body and wherein the semiconductor chips are each free of package body material on a radiation exit face of the semiconductor device opposite a mounting surface,
    wherein to form the fillets the semiconductor chips are encapsulated prior to step b) with an auxiliary material in such a way that the side faces of the semiconductor chips are at least partly covered and the auxiliary material is encapsulated in step b) by a molding composition for the package body assembly,
    wherein the auxiliary material is applied to an auxiliary carrier and the semiconductor chips are pressed into the auxiliary material such that the auxiliary material covers the side faces of the semiconductor chips at least in part, and wherein the semiconductor chips extend right through the package bodies body.

2. The method according to claim 1, wherein the fillet is radiation-transmissive or has a reflectivity of at least 80%.

3. The method according to claim 1, wherein the semiconductor chips are each free of package body material on the mounting surface of the semiconductor devices.

4. The method according to claim 1, in which the semiconductor chips are arranged on an auxiliary carrier during application of the encapsulating material and the encapsulating material is applied such that it in each case at least partly covers the side faces of the semiconductor chips and the auxiliary carrier.

5. The method according to claim 1, in which the encapsulating material is a filler material, which remains in the semiconductor devices.

6. The method according to claim 1, in which the encapsulating material is an auxiliary material, which is removed after step b).

7. The method according to claim 1, wherein step c) is performed after step b), wherein material of the package body assembly is removed to form the fillets.

8. The method according to claim 6, in which the fillet is filled with a filler material after step b).

9. The method according to claim 1, wherein the semiconductor chips are covered over in step b) and the package body assembly is then thinned, such that the semiconductor chips are uncovered in places.

* * * * *